(12) United States Patent
Gerhard et al.

(10) Patent No.: US 7,434,856 B2
(45) Date of Patent: Oct. 14, 2008

(54) GRIPPER AND METHOD OF OPERATING THE SAME

(75) Inventors: Detlef Gerhard, München (DE); Johannes Lechner, München (DE); Martin Renner, Unterhaching (DE)

(73) Assignee: ICOS Vision Systems N.V., Heverlee (BE)

( * ) Notice: Subject to any disclaimer, the term of this patent is extended or adjusted under 35 U.S.C. 154(b) by 20 days.

(21) Appl. No.: 10/539,774

(22) PCT Filed: Dec. 4, 2003

(86) PCT No.: PCT/DE03/03987

§ 371 (c)(1),
(2), (4) Date: May 23, 2006

(87) PCT Pub. No.: WO2004/056678

PCT Pub. Date: Jul. 8, 2004

(65) Prior Publication Data

US 2006/0249965 A1   Nov. 9, 2006

(30) Foreign Application Priority Data

Dec. 19, 2002   (DE) .............................. 102 59 836

(51) Int. Cl.
*B25J 15/06*   (2006.01)

(52) U.S. Cl. ..................................... 294/64.1; 414/935

(58) Field of Classification Search ............... 294/1.1, 294/64.1; 414/935, 936, 941
See application file for complete search history.

(56) References Cited

U.S. PATENT DOCUMENTS

| 4,620,738 | A | * | 11/1986 | Schwartz et al. | 294/64.1 |
| 4,904,012 | A |   | 2/1990  | Nishiguchi et al. |  |
| 5,580,112 | A | * | 12/1996 | Lin et al. | 294/64.1 |
| 5,636,964 | A | * | 6/1997  | Somekh et al. | 414/806 |
| 5,765,889 | A | * | 6/1998  | Nam et al. | 294/64.1 |
| 6,062,241 | A | * | 5/2000  | Tateyama et al. | 134/137 |
| 6,068,316 | A | * | 5/2000  | Kim et al. | 294/64.1 |
| 6,077,026 | A | * | 6/2000  | Shultz | 414/744.1 |
| 6,336,787 | B1 |  | 1/2002  | Chang et al. |  |
| 2003/0133776 | A1 | | 7/2003 | Lee |  |

FOREIGN PATENT DOCUMENTS

| DE | 43 04 301 | 8/1994 |
| EP | 1 233 442 | 8/2002 |
| WO | 99/62107  | 12/1999 |

* cited by examiner

*Primary Examiner*—Dean J Kramer
(74) *Attorney, Agent, or Firm*—Staas & Halsey LLP

(57) ABSTRACT

The invention relates to a gripper for handling frames (2) that are covered with a film (3) that is intended for the transport of wafers (6). The gripper comprises at least two flat fingers (10) that carry flattened finger tips (8). This construction allows to insert the gripper between two frames (2) that are mounted in a cassette (9) without complication. The fingers (10) support in subsections both the frame (2) and the film (3). The film is attached to the frame due to the suction effect exerted by vacuum openings (5) configured on the frame, thereby fixating the film on the gripper.

7 Claims, 2 Drawing Sheets

GRIPPER AND METHOD OF OPERATING THE SAME

Figure 1:
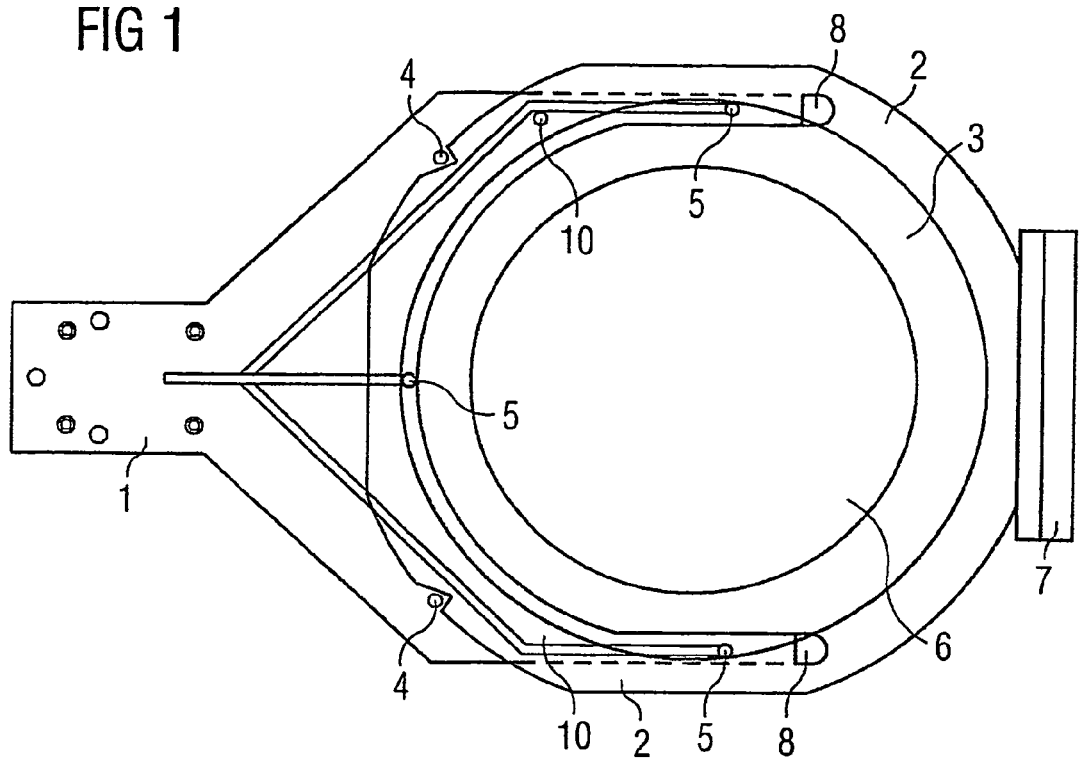

The invention relates to a gripper for handling frames in the so-called backend production of chips. At this point, finished, processed wafers are glued onto annular frames covered with film, cut to separate them and then provided with a casing which is usually made of plastic. Appropriate grippers are required to handle the frames, which have to be transported with or without wafers.

The frames are flat, round plastic frames. A frame is usually of annular shape and has a film cover so that the inner, usually circular, region is covered by the film in plan view. A processed wafer is glued onto this film. Following the cutting process, once all the individual chips contained on a wafer have been separated, the entire structure consisting of frame, film and the plurality of chips glued thereon is highly flexible. The relatively heavy semiconductor elements often cause considerable deformation of the film, so that the latter hangs downward. In order to transport the frames, use is made of so-called frame cassettes which accommodate up to 25 frames. The width of the cassettes is adapted to the diameter of the frames, wherein the cassettes have horizontal slots lying above one another for receiving a plurality of frames.

In order to be able to handle the frames with film and wafer in the so-called preassembly area, use is usually made of robots comprising a suitable gripper. This gripper loads and unloads the cassettes and guides the frames with film and wafer to various processing stations and returns them from there in order to place them back in cassettes.

The removal of frames or the loading of the cassettes with these frames is the most complicated operation in such a transport process. The cause of various problems is in particular the flexibility of the frames and the narrow slot spacing in the cassettes in which the frames are stored one above the other. These two problems usually lead to sporadic errors and respectively to a downtime of the system.

Various variants of grippers are known which are designed as pincer grippers. The problem with this technology is that of combining the size of the gripper with the frames which are stored tightly in a cassette. Such a pincer gripper is not suitable for passing into a slot in a cassette, since the two cooperating systems required for a pincer gripper can be introduced into a filled cassette only with difficulty. The pincer gripper will sporadically lead time and time again to collisions between frame and cassette. It should furthermore be taken into account that the film stretched onto the frame hangs downward to a considerable extent on account of being loaded with a wafer.

It is an object of the invention to provide a gripper and a method of operating the same, whereby annular frames with a film covering for transporting wafers can be reliably loaded into and unloaded from cassettes provided with slots lying one above the other.

This object is achieved by the respective combinations of features of the denendent claims.

Advantageous embodiments can be found in the dependent claims.

The essential aspect of the invention consists in that the gripper has just one support surface so that it can pass below a frame with film between two such elements lying above one another which are stored in a cassette in two adjacent slots. To this end, the gripper has fingers which support the frame and also partial regions of the film, in particular the outer region of the film. Supporting the film means in this case that the film is supported in the region in which it is freely accessible, whereby the parts of the film which overlap with the frame for gluing purposes are not involved.

In the regions of the gripper or fingers which come to lie below the film in plan view, so-called vacuum openings are positioned on the gripper, by means of which vacuum openings suction can be exerted on the film at certain points. A frame with film and possibly a wafer located thereon can thus be mechanically supported by the gripper and at the same time be fixed by the plurality of vacuum openings cooperating with the film.

One advantageous embodiment of the invention provides that the vacuum openings are positioned in the outer region of the film so that simultaneous supporting of the frame by the fingers is ensured.

In order to pass to the various processing stations, the frame should be precisely oriented relative to the gripper beforehand, for example by means of adjustment pins which either correspond to matching cutouts on the frame or bring about a central alignment by virtue of their suitably selected spacing on the circular outer edge of the frame. For this reason, prealignment is carried out by means of adjustment pins which are present on the gripper and correspond to cutouts on the frame. This prealignment is optimized by providing a stop on the rear side of the cassette in the direction in which the frames are loaded into the cassette, against which stop the frame is pressed in collaboration with the adjustment pins, so that a reliable lateral alignment between frame and gripper is possible.

During operation of a gripper 1 according to the application, frames can thus be received without any problem in a densely occupied cassette and can be fixed relative to the gripper by virtue of vacuum fixing in the aligned state.

Hereinbelow, an example of embodiment will be described with reference to schematic figures which do not limit the invention.

Figure 2:
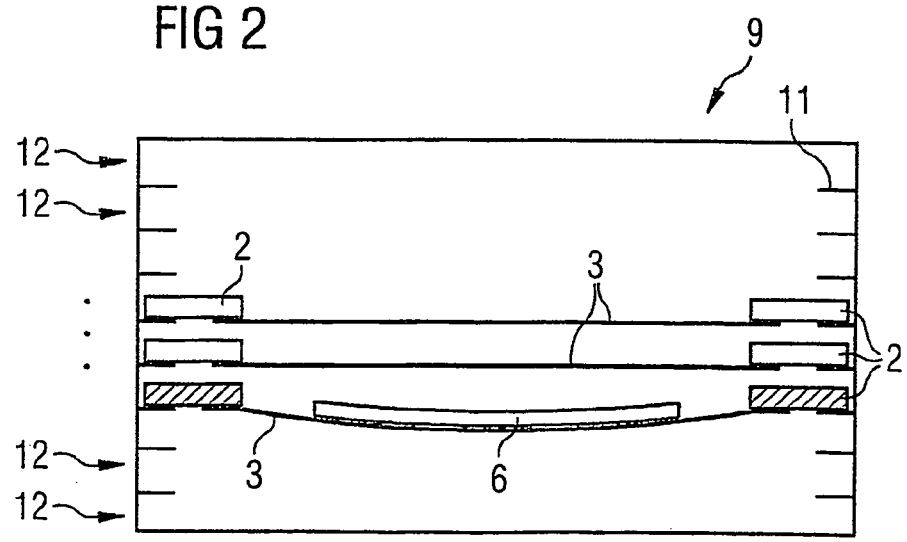
Figure 3:
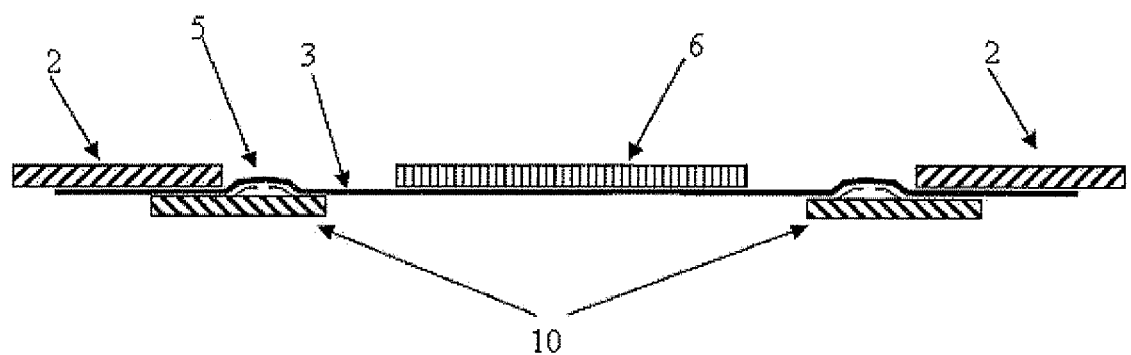

FIG. 1 shows a gripper 1 with frame 2 and film 3 and also adjustment pins 4 and a stop 7;

FIG. 2 shows the front view of a cassette 9 with transverse slots 12 for the horizontal storage of frames 2 one above the other; and FIG. 3 shows a cross-section in a vertical direction through frame 2.

FIG. 1 shows an example of embodiment of a gripper 1 according to the invention. Said gripper has in this case two fingers 10 for holding the frame 2. The vacuum openings 5, by means of which suction can be exerted on the film 3, are arranged in the outer region of the film 3, that is to say close to the outer edge of the film adjacent to the inner edge of the annular frame 2. The vacuum openings 5 have an upward-facing opening with a slightly raised height which goes beyond the upper surface of the gripper 1, so that they are securely in contact with the film 3. The fingers 10 provided with the flattened finger tips 8 grip in partial regions in each case below the frame 2 and the film 3. The design of the finger tips 8 serves for better insertion between the various frames 2 in a cassette 9.

The film 3, which is stretched onto the annular frame 2, usually bears a wafer 6 which varies in size and comprises a large number of finished, processed chips which are to be held on the film in a cutting process.

In order to be transported by a gripper 1, which is also referred to as a paddle, the frame 2 should be precisely aligned relative to the latter, in order to simplify the positioning process in a processing station. To this end, cutouts are advantageously provided on the frame 2 and, as the gripper 1 enters the cassette 9, adjustment pins 4 fitted on the gripper 1 engage in said cutouts and press the wafer against a stop 7. This alignment of the frame relative to the gripper is brought about by virtue of the cooperation of the adjustment pins with the cutouts and of the outer contours of the frame with the stop 7. Following the alignment, vacuum is applied via the vacuum openings 5, whereby the film 3 and the frame 2 are held relative to the gripper 1.

The raised areas at the vacuum openings 5 are preferably rounded at the top in order to prevent damage to the film. The adjustment pins 4 are small rollers which project in a vertical direction and dip into the notches of the frame. There is preferably an opening at a position of a vacuum opening 5, although any other configuration with a number of openings at a fixing point is possible.

During operation, for removal purposes, the entering of the gripper into the cassette 9 and the subsequent alignment, fixing and removal of the frame 2 from the cassette 9 take place in a manner analogous to the loading operation but in the inverse order, wherein the alignment process may be omitted in the loading operation.

FIG. 2 shows the front view of a cassette 9 which has horizontal slots 12. The slots are in each case defined by the supports 11 which carry a frame 2 only at the outer regions. The figure shows films 3 without any loading and in the bottom case with a glued-on wafer 6. The weight of the wafer 6 leads to the film 3 bending and hanging downward. This is particularly the case when the wafer 6 has already been cut, so that there is a relatively unstable structure consisting of frame 2, film 3 and wafer 6 or individual chips. In order to prevent damage to the film 3 and the wafer 6, the fingers 10 of the gripper travel into the region below the frame 2 in which the transition between the frame inner edge and the film 3 is located.

The invention claimed is:

1. A combined set comprising a gripper and an annular frame, the gripper comprising at least two fingers aligned substantially parallel to one another and arranged at a distance from one another, said frame being supported by the at least two fingers, and wherein a film provided for bearing a wafer is stretched onto said frame, said gripper having vacuum lines ending at the upper surface of the fingers of the gripper in the form of a number of vacuum openings with a raised outlet for partially supporting said frame with the film stretched thereon, said vacuum opening being positioned for exerting a suction at certain points of said film.

2. The combined set as claimed in claim 1, wherein said fingers are provided for at least partially supporting said film in an outer region thereof.

3. The combined set as claimed in claim 2, wherein said vacuum openings correspond to said outer region of the film.

4. The combined set as claimed in claim 1, wherein adjustment pins are fitted on the gripper, which adjustment pins correspond to cut-outs on the frame for the purpose of mutual alignment.

5. The combined set as claimed in claim 1, wherein said film and said frame overlap each other partially in a region and wherein in said region said film is not supported by said fingers.

6. The combined set as claimed in claim 1, wherein said fingers having fingertips, which are flattened towards a front thereof.

7. A gripper as a component of a combined set, which combined set comprising a gripper and an annular frame, the gripper comprising at least two fingers aligned substantially parallel to one another and arranged at a distance from one another, said frame being supported by the at least two fingers, and wherein a film provided for bearing a wafer is stretched onto said frame, said gripper having vacuum lines ending at the upper surface of the fingers of the gripper in the form of a number of vacuum openings with a raised outlet for partially supporting said frame with the film stretched thereon, said vacuum openings being positioned for exerting a suction at certain points of said film.

* * * * *